(12) United States Patent
Jeong et al.

(10) Patent No.: US 6,518,140 B2
(45) Date of Patent: Feb. 11, 2003

(54) MANUFACTURING METHODS FOR DEFECT REMOVABLE SEMICONDUCTOR DEVICES

(75) Inventors: Hee-Geun Jeong, Seoul (KR); Yong-Shik Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/969,179

(22) Filed: Sep. 28, 2001

(65) Prior Publication Data

US 2002/0017662 A1 Feb. 14, 2002

Related U.S. Application Data

(62) Division of application No. 09/434,623, filed on Nov. 5, 1999, now Pat. No. 6,320,243.

(51) Int. Cl.⁷ .............................................. H01L 21/331
(52) U.S. Cl. ....................................... 438/333; 438/281
(58) Field of Search ................................ 438/132, 333, 438/281, 460, 467, 463, 600, 601, 625

(56) References Cited

U.S. PATENT DOCUMENTS

| 5,585,662 A | 12/1996 | Ogawa ........................ 257/529 |
| 5,650,355 A * | 7/1997 | Fukuhara et al. ............ 437/189 |
| 5,851,903 A | 12/1998 | Stamper ....................... 438/467 |
| 5,936,296 A * | 8/1999 | Park et al. .................... 257/529 |
| 5,976,917 A * | 11/1999 | Manning ...................... 438/132 |
| 6,320,243 B1 * | 11/2001 | Jeong et al. .................. 257/529 |

OTHER PUBLICATIONS

Cenker et al., *A Fault–Tolerant 64K Dynamic Random–Access Memory*, IEEE Transactions on Electron Devices, vol. ED–26, No. 6, Jun. 1979, pp. 853–860.

* cited by examiner

*Primary Examiner*—David Nelms
*Assistant Examiner*—David Nhu
(74) *Attorney, Agent, or Firm*—Myers Bigel Sibley & Sajovec

(57) ABSTRACT

A defect removable semiconductor element and the manufacturing method thereof are provided with a protective layer covering fuses exposed at a part of the redundancy memory cell region, the layer being thinner than the one covering the main memory cell region, so that a predetermined fuse is cut off for removing a defect without damaging adjacent fuses even if the amount of energy of laser beam to be applied is greater and the size of the spot to be focused is bigger, thereby improving operational conditions in the energy of the laser beam to be applied and the size of a spot to be focused and the operational reliability in removing a defect.

8 Claims, 3 Drawing Sheets

MANUFACTURING METHODS FOR DEFECT REMOVABLE SEMICONDUCTOR DEVICES

CROSS-REFERENCE TO RELATED APPLICATION

This application is a divisional of application Ser. No. 09/434,623, Nov., 5, 1999, U.S. Pat. No. 6,320,243 entitled Defect Removable Semiconductor Devices and Manufacturing Methods Thereof, and claims the benefit of Korean Patent Application No. 1998-47655, filed Nov. 7, 1998, the disclosure of which is hereby incorporated herein by reference in its entirety as if set forth fully herein.

BACKGROUND OF THE INVENTION

1. Field of the Invention

The present invention relates to a semiconductor device and the manufacturing method thereof, and more particularly to a defect removable semiconductor device and the manufacturing method thereof where a fuse can be cut off by laser beam with other adjacent fuses being protected.

2. Description of the prior art

As the degree of integration of the dynamic random access memory (DRAM) in the semiconductor device gets higher, the size of the memory cell of the DRAM gets smaller. If one of many DRAM memory cells has a defect, the DRAM is not properly functioning to be determined as a defective product. However, it may be possible to have a small number of defective memory cells while the degree of integration of the DRAM is kept high in the semiconductor element. If all those DRAMs are discarded as defective products, the yield of final products is greatly lowered. It has been regarded as unproductive.

Recently, redundancy cells have additionally been installed in the DRAM along with the main memory cells. In case that a defect occurs in one of the main memory cells, a redundancy cell replaces the defective main memory cell to improve the yield of the DRAMs.

The DRAM redundancy memory cells are installed in respective sub-array blocks. A spare row/column line has been previously disposed at every 256K cell array. The defective main memory cell is replaced by the spare redundancy memory cell in an unit of the row/column line. When wafer levels of operations are completed, a defective memory cell is determined and separated at a testing step and then the programming operation which substitutes the address of the defective memory cell with that of a spare memory cell is performed in an internal circuit. Therefore, when the address relating to the defective row/column line is inputted, the spare row/column line is selected for the defective row/column line.

The programming operation includes melting down a fuse with over-current, burning down a fuse with laser beam, shorting a junction with a laser beam and programming into an erasable and programmable ROM (EPROM) memory cell, etc. Among them, cutting off the fuse with laser beam is commonly used because of operational simplicity and effectiveness and easiness in layout of fuses. Polycrystalline silicon wiring or metal wiring is used for fuses. In relation to this, a thesis titled Laser Programmable Redundancy And Yield Improvement In A 64K Dynamic Random-Access Memory has been disclosed in IEEE Transactions on Electron Devices, Vol. ED-26, pp. 853–860, 1979.

On the other hand, there are physical and logical programming methods for replacing a defective column/row line with a spare one by means of the laser beam. The physical programmable method includes replacing a defective column/row line with a spare one and deactivating a decoder related to the defective column/row line.

In the former method, there is no loss of operational speed caused by a repairing process with the redundancy cells because one defective column/row line is directly replaced by one spare column/row line and no time is needed for comparing addresses to deactivate the defective column/row line. However, this method is known to be disadvantageous in keeping a high degree of integration due to the size and accuracy of fuse blow, since the layout pitches of the fuse and the word line should be matched.

Therefore, in the latter method, which has been mainly used, the fuse is inserted into a decoder circuit where a decoder related to the defective column/row line is deactivated. Generally, the DRAM shares a decoder in every 4 word lines, widening the layout pitch of the fuse. However, this method has been proved unsuitable in maintaining the high degree of integration because the number of fuses increases for the higher degree of integration.

In the aforementioned logic programmable method, when the address related to the defective word line is inputted, a pulse is generated to disable a normal decoder, thereby controlling to block the operation of normal word lines and to operate only the spare word lines. In this method, a signal, generated as a result of the determination at the address comparison circuit where it is determined whether the inputted address selects a defective cell, non-selects normal decoders, so that the same amount of time as being taken for determination in the comparison circuit is lost for accessing.

Besides, there are other methods for improving repairing efficiency by installing a plurality of spare word lines to replace more defective cells with a predetermined number of spare cells and for maintaining the high efficiency in repairing a smaller number of fuses.

On the other hand, a great attention has recently been drawn to a merged DRAM/logic (MDL) process, which is characterized by superior function of transistors, a high degree of integration in memory, an advantage of multi-layered wiring process and the composition of one chip including logic circuit and DRAM. Because the multi-layered wiring is not required in the conventional DRAM process, a polycrystalline silicon layer has been used as a fuse. However, instead of the polycrystalline silicon used as a word line in the conventional method, a part of the uppermost metal wire is used as a fuse in the MDL process requiring the multi-layered wiring, because the surface difference of the upper layer insulator film is large.

In the conventional semiconductor element with the MDL process, as shown in FIG. 1, insulating interlayer 20 is deposited at a main memory cell region and a redundancy memory cell region of the substrate 10. Final metal wires 30 are arranged on the insulating interlayer 20. A first protective layer 40 covers the insulating interlayer 20 which includes the metal wire 30.

The metal wire 30 is composed of a multi-layered structure having a Ti/TiN layer for a fuse 31 at the bottom, an aluminum layer 33 at the middle and TiN 35 layer for a cap at the top. However, there are a mono-layered structure of Ti/TiN layers 31a, 31b, 31c, 31d in an aperture portion of the first protective layer 40.

For a brief description, all the units installed in the conventional method below the substrate 10, such as transistors, accumulative capacitors, insulating interlayer, contact plugs, word lines, bit line, metal wire, etc., are not shown in the drawings.

In the semiconductor element thus constructed, if the fuse of the metal wire needing defect removal is Ti/TiN 31a, it is cut off by a laser beam (not shown) of 0.15 µJ.

BRIEF DESCRIPTION OF THE DRAWINGS

For fuller understanding of the nature and objects of the invention, reference should be made to the following detailed description taken in conjunction with the accompanying drawings in which.

SUMMARY OF THE INVENTION

Figure 1:
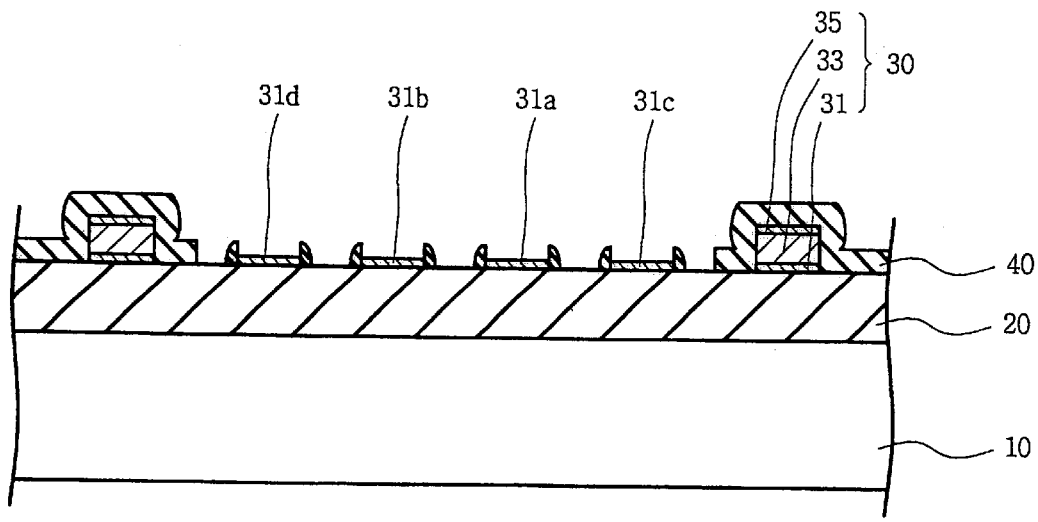
FIG. 1 is a cross-sectional view for illustrating a defect removable conventional semiconductor device.

Since all the Ti/TiN layers 31a, 31b, 31c, 31d are exposed in the conventional semiconductor device, the laser beam which is applied for defect removal through the aperture portion of the first protective layer 40 to the Ti/TiN 31a may be reflected to the other Ti/TiN layers 31b, 31c, causing a damage.

Especially, when a laser controlling unit (not shown) for applying laser beam malfunctions to transmit a higher energy to the Ti/TiN 31a than the reference value of 0.15 µJ, the Ti/TiN 31b, 31c may be easily damaged. With a slight damage of the laser beam, the Ti/TiN layers 31b, 31c, 31d would be partly cut off to be unstable. Also, with a severe damage, they would be completely cut off. On the other hand, if laser beam having an energy of under 0.15 µJ is applied to the Ti/TiN layer 31a, it may not be properly cut off.

Furthermore, if laser beam is not well focused just on the Ti/TiN layer 31a, only a designated spot, but widely spread, the adjacent Ti/TiN layers 31b, 31c, 31d may be more easily affected to be cut off.

Therefore, it is necessary to thoroughly manage the amount of laser beam energy for defect removal and to precisely control the size of laser beam to be focused. There are problems in the conventional method in that operational procedures of defect removal have been complicated with poor operational reliability.

It is an object of the present invention to secure an easy operation of defect removal of a semiconductor element by applying laser beam to a predetermined fuse without causing a damage on adjacent ones.

It is another object of the present invention to improve operational reliability of defect removal of a semiconductor element by applying laser beam to a predetermined fuse without causing a damage on adjacent ones.

In order to accomplish the aforementioned objects, there is provided in the present invention a defect removable semiconductor device, comprising:

a substrate having respective regions of main memory cells and redundancy memory cells;

an insulating interlayer deposited on the substrate;

a metal wire of a multi-layered structure arranged with a series of fuses being exposed at a part of the redundancy memory cell region;

a first protective layer covering all the metal wire except the exposed fuses for protection; and a second protective layer covering the exposed fuses for protecting adjacent fuses from being damaged when laser beam is applied for defect removal to a predetermined fuse, one of the exposed fuses.

The second protective layer is made thinner than the first protective layer, having a desired thickness within a range of 100 Å–10000 Å, the most desired thickness of 3000 Å. Also, the second protective layer may be made of a mono-layered structure or a multi-layered structure.

In order to achieve the aforementioned objects, the manufacturing method of the defect removable semiconductor element in the present invention comprises the steps of:

accumulating the layer insulator film on respective regions of main memory cells and redundancy memory cells of the substrate;

arranging the metal wire having multi-layered fuses on the layer insulator film;

covering the first protective layer on metal wire for protection;

etching the metal wire disposed on the aperture portion which has been formed at a predetermined portion of the first protective layer for exposing a series of fuses installed at a part of the redundancy memory cells; and covering the second protective layer on the exposed fuses for preventing adjacent fuses from being damaged when laser beam is applied for defect removal to the predetermined fuse, one of the exposed ones.

It is recommended that the second protective layer should be made thinner than the first protective layer, having a desired thickness within a range of 100 Å to 10000 Å (angstrom), the most desired thickness of 3000 Å. Also, the second protective layer may be made of a mono-layered structure or a multi-layered structure.

Therefore, there are advantages in the present invention in that a predetermined fuse can be cut off by laser beam for defect removal without damaging adjacent fuses even if the amount of energy of the laser beam to be applied is greater and the size of the spot to be focused is bigger, so that it may not be necessary to control the amount of energy of laser beam to be applied and to precisely manage the focus of the laser beam to restrict the size thereof, flexibly controlling an operational condition in applying the laser beam and improving the operational reliability in defect removal of the semiconductor element.

DETAILED DESCRIPTION OF THE PRESENT INVENTION

Figure 2:
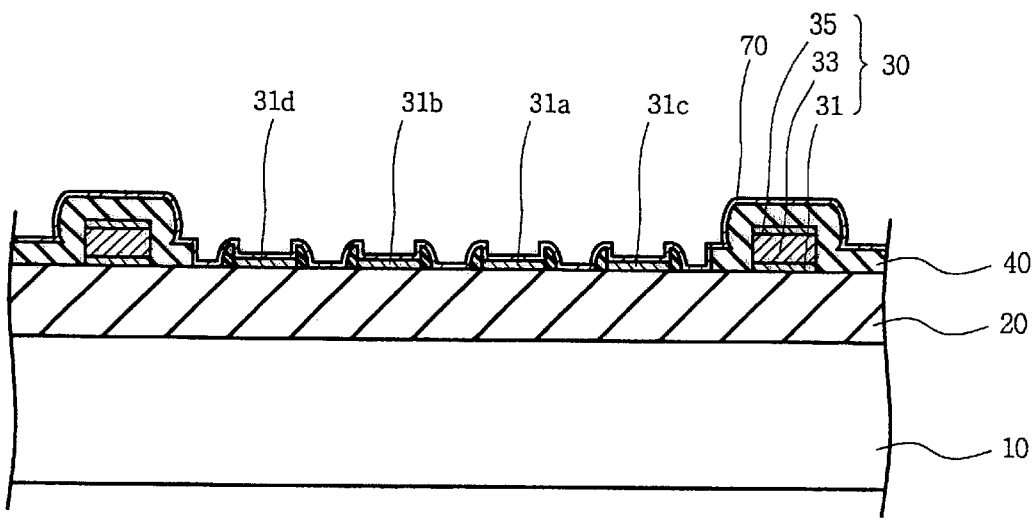
FIG. 2 is a cross-sectional view for illustrating a defect removable semiconductor device in accordance with the present invention.

The structure of a defect removable semiconductor device and the manufacturing method thereof of the present invention will be described in detail with the accompanying drawings. FIG. 2 is a cross-sectional view for illustrating a defect removable semiconductor device in accordance with the present invention, and FIGS. 3 through 6 are diagrams for illustrating the manufacturing procedures of the defect removable semiconductor device. The same portions of the semiconductor device in the present invention will be referred by the same symbols used for as those in the conventional semiconductor element.

As shown in FIG. 2, an insulating interlayer 20 is deposited at respective regions of main memory cells and redundancy memory cells of a substrate 10. Final metal wires 30 are arranged on the insulating interlayer 20. A first protective layer 40 covers the insulating interlayer 20 including the metal wires 30 for protection.

The metal wire 30 is composed of a multi-layered structure having Ti/TiN layer 31 for a fuse at the bottom, an aluminum layer 33 at the middle and TiN 35 layer for a cap at the top. However, there are a mono-layered structure of Ti/TiN layers 31a, 31b, 31c, 31d in an aperture portion of the first protective layer 40.

Also, a second protective layer 70 covers the first protective layer 40 having Ti/TiN layers 31a, 31b, 31c, 31d for preventing a damage on adjacent fuses when laser beam is applied to a predetermined fuse for defect removal.

It is recommended that the second protective layer should be made thinner than the first protective layer, having a desired thickness within a range of 100 Å to 10000 Å, the most desired thickness of 3000 Å. Also, the second protective layer may be made of a mono-layered structure or a multi-layered structure.

For a brief description, all the units installed in the conventional method below the substrate 10, such as transistors, accumulative capacitors, insulating interlayer, contact plugs, word lines, bit line, metal wire, etc., are not shown in the drawings.

The semiconductor element thus constructed will be described in detail with reference to FIGS. 3 through 6.

Figure 3:
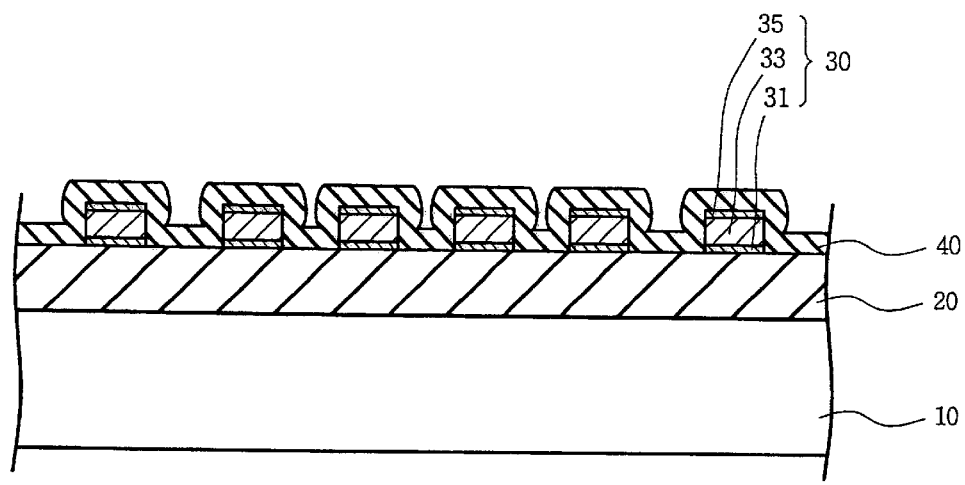
FIGS. 3 through 6 are diagrams for illustrating manufacturing procedures of a defect removable semiconductor device in accordance with the present invention.

As shown in FIG. 3, the insulating interlayer 20 is accumulated at the regions of the main memory cells and the redundancy memory cells of the substrate 10. It should be taken for granted that all the units such as transistors, accumulative capacitors, layer insulator film, contact plugs, word lines, bit lines, metal wires, etc. are installed below the substrate 10, even if they are not shown in the drawings.

Final metal wires 30 are disposed on the layer insulator film 20. To describe them in detail, a Ti/TiN layer 31 for a fuse, an aluminum layer 33 and TiN layer 35 for a cap are accumulated in sequence. It may be desirous that the Ti/TiN layer 31 has a thickness within a range of 100 A–2000 A.

Next, undesired portions of the TiN layer 35, the aluminum layer 33 and the Ti/TiN layer 31 are sequentially removed by a photo-engraving process, forming a pattern of metal wires on the insulating interlayer 20.

Furthermore, a first protective layer 40, for example, a conventional passivation layer, is disposed for protecting the metal wires 30.

Figure 4:
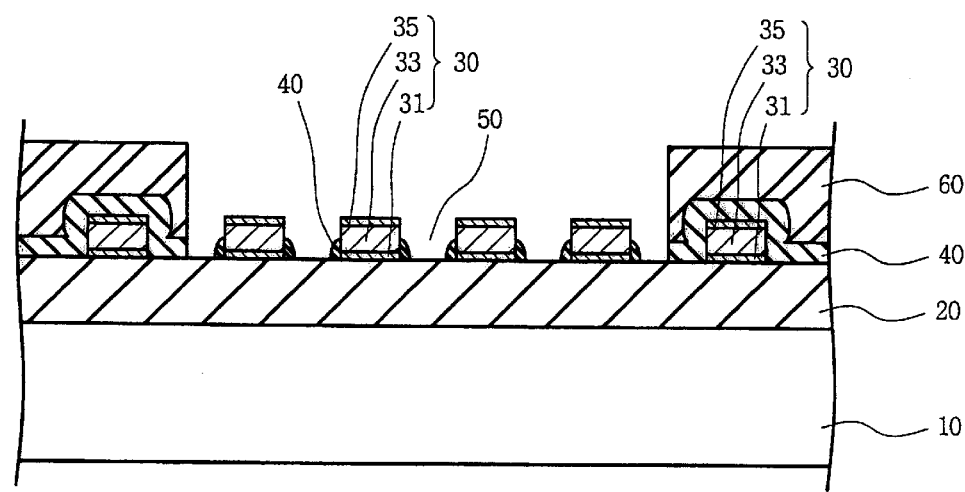

As shown in FIG. 4, a predetermined pattern of photosensitive layers 60 is formed on the first protective layer 40 for exposing the fuses located at a part of the redundancy memory cell region.

The pattern of photosensitive layer 60 is used as a mask for dry-etching the first protective layer 40, thereby forming the aperture portion 50 at the first protective layer 40 and exposing the metal wires 30 located inside the aperture portion 50. At this time, it is recommended that the TiN layer 35 for a cap and some of the upper portion of the lateral side of the aluminum layer 33 should be exposed and that a side wall spacer of the first protective layer 40 should be formed at the lateral lower portion of the Ti/TiN layer 31 for fuses and of the aluminum layer 33. The side wall spacer of the first protective layer 40 is made not to damage the Ti/TiN layer 31 when the TiN layer 35 and the aluminum layer 33 are etched in the following manufacturing step.

Figure 5:
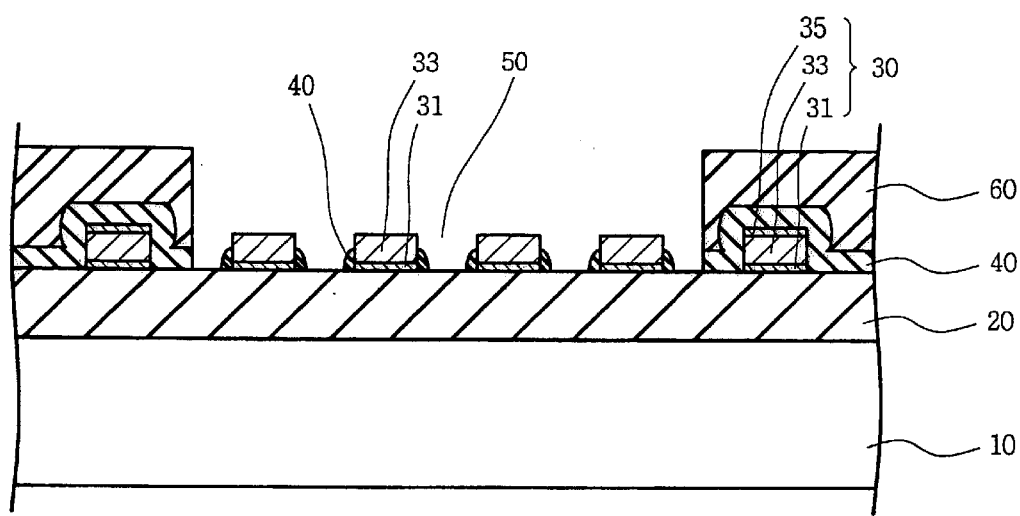

As shown in FIG. 5, the TiN layer 35 and the aluminum layer 33 inside the aperture portion 50 are etched by the dry-etching process. At this time, approximately half of the initial thickness of the aluminum layer 33 is recommended to be maintained for protecting the Ti/TiN layer 31 from being damaged. Also, it is recommended that a side wall spacer of the first protective layer 40 should be formed at a lateral lower portion of the Ti/TiN layer 31 and the aluminum layer 33.

Figure 6:
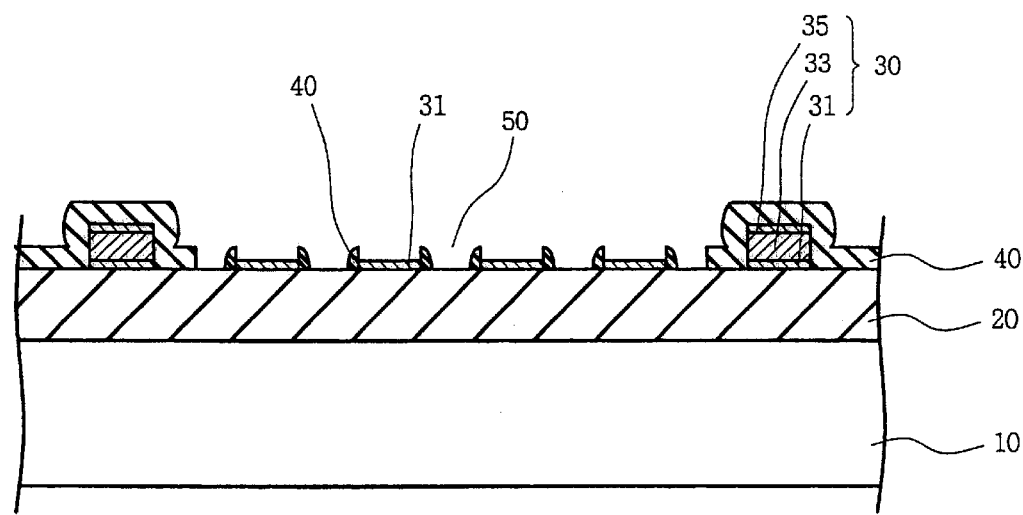

As shown in FIG. 6, the pattern of the photosensitive layer 60 is removed, and the aluminum layer 33 is wet-etched by using the first protective layer 40 as a mask until the upper surface of the Ti/TiN layer 31 is exposed. At this time, the side wall spacer of the first protective layer 40 still remains at the lateral portion of the Ti/TiN layer 31.

Thus, the Ti/TiN layer 31 is kept exposed at the aperture portion 50, while the TiN layer 35, the aluminum layer 33 and the Ti/TiN layer 31 are protected by the first protective layer 40 in the other region of the insulating interlayer 20.

Finally, when a defect is removed by laser beam, the second protective layer 70 is placed to completely cover the whole semiconductor element including the Ti/TiN layer 31. At this time, the passivation layer of the metal wires 30 is made of the first and second protective layers 40, 70.

Furthermore, the second protective layer 70 is made thinner than the first protective layer 40, having a desired thickness within a range of 100 Å–10000 Å, the most desired thickness of 3000 Å. At this time, the second protective layer 70 should be thick enough to protect adjacent fuses from being damaged when laser beam is applied to a predetermined fuse for defect removal. Also, the second protective layer may be made of a mono-layered structure or a multi-layered structure, for instance, a double or triple layer structure.

Therefore, if the fuse requiring the defect removal is Ti/TiN 31a at the test step, it is cut off by laser beam (not shown) having an energy of 0.15 $\mu$J, like in the conventional method, without damaging adjacent fuses of Ti/TiN layers 31b, 31c because the second protective layer 70 effectively shuts out the laser beam which is reflected from the Ti/TiN layer 31a toward the adjacent Ti/TiN layers 31b, 31c.

Furthermore, the laser beam of an even higher energy, up to 0.3 $\mu$J, may be applied to the Ti/TiN layer 31a for defect removal without damaging adjacent Ti/TiN layers 31b, 31c, thereby widening the range of the energy of the laser beam to be used in the present invention.

Even if the laser beam is applied to a little larger spot, only the Ti/TiN layer 31a is cut off without any damage on adjacent Ti/TiN layers 31b, 31c. Therefore, it is not necessary to precisely control the size of the laser beam to be focused, so that the operational condition in applying laser beam is less restricted.

On the other hand, the present invention can also be applied for the defect removal to any fuse which is formed on a substrate of liquid crystalline indicating apparatus, for instance, an insulating film made of glass.

As described above, in the defect removable semiconductor element and the manufacturing method thereof, the fuses exposed at a portion of the redundancy memory cell region are protected by a protective layer thinner than that of the main memory cell region.

Accordingly, a desired fuse can be cut off for defect removal without damaging other adjacent fuses even if the amount of energy of laser beam to be applied is greater and the size of the spot to be focused is bigger, so that it may neither be necessary to control the amount of energy of laser beam to be applied nor to precisely manage the size of laser beam to be focused, improving the operational easiness and reliability in defect removal of the semiconductor element.

Even if an embodiment of the present invention is described here, the actual scope of the present invention is not limited in the presented embodiment. It is believed evident that many variations be made by those skilled in the art without departing from the spirit and scope of this invention.

What is claimed is:

1. A manufacturing method for an integrated circuit, the method comprising the steps of:
    forming a metal wiring layer including a plurality of sublayers on an integrated circuit substrate;
    covering a first protective layer on the metal wiring layer;
    etching the first protective layer and at least one of the sublayers at a predetermined portion of the integrated circuit substrate to define a series of fuses; and
    forming a second protective layer on the first protective layer and on the series of fuses to prevent adjacent fuses from being damaged when a laser beam is applied to a predetermined fuse.

2. The method, as defined in claim 1, wherein the second protective layer is thinner than the first protective layer.

3. The method, as defined in claim 2, wherein the second protective layer has a thickness within a range of 100 Å–10000 Å.

4. The method, as defined in claim 2, wherein the second protective layer has a thickness of 3000 Å.

5. The method, as defined in claim 2, wherein the second protective layer is a mono-layered structure.

6. The method, as defined in claim 2, wherein the second protective layer is a multi-layered structure.

7. The method, as defined in claim 1, wherein the second protective layer is a conformal second protective layer, conformally on the first protective layer and on the series of fuses.

8. The method, as defined in claim 2, wherein the second protective layer is a conformal second protective layer, conformally on the first protective layer and on the series of fuses.

* * * * *